United States Patent
Liu (10) Patent No.: US 11,967,959 B2
(45) Date of Patent: Apr. 23, 2024

(54) CLOCK DATA RECOVERY CIRCUIT AND METHOD HAVING QUICK LOCKING AND BANDWIDTH STABILIZING MECHANISM

(71) Applicant: REALTEK SEMICONDUCTOR CORPORATION, Hsinchu (TW)

(72) Inventor: Hsi-En Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 24 days.

(21) Appl. No.: 17/861,657

(22) Filed: Jul. 11, 2022

(65) Prior Publication Data
US 2023/0022377 A1 Jan. 26, 2023

(30) Foreign Application Priority Data
Jul. 13, 2021 (TW) .................. 110125697

(51) Int. Cl.
*H03L 7/08* (2006.01)
*H03L 7/089* (2006.01)
*H03L 7/091* (2006.01)

(52) U.S. Cl.
CPC ............ *H03L 7/0807* (2013.01); *H03L 7/089* (2013.01); *H03L 7/091* (2013.01)

(58) Field of Classification Search
CPC .... H03D 3/24; H03L 7/00; H03L 7/08; H03L 7/087; H03L 7/089; H03L 7/091; H03L 7/093; H03L 7/099; H03L 7/0807; H04L 7/00; H04L 7/007; H04L 7/033; H04L 25/40; G06F 1/08; G06F 1/10

USPC ........ 327/141, 148, 155, 159; 375/344, 354, 375/371–376
See application file for complete search history.

(56) References Cited

U.S. PATENT DOCUMENTS

| 9,455,725 | B2 | 9/2016 | Hung et al. |
| 10,256,967 | B2 | 4/2019 | Huang et al. |
| 11,677,536 | B2 * | 6/2023 | Kim ...................... H04L 7/0037 375/354 |
| 2013/0259178 | A1 | 10/2013 | Bae et al. |
| 2021/0399732 | A1 * | 12/2021 | Lee ......................... H03L 7/091 |

* cited by examiner

*Primary Examiner* — Shawkat M Ali
(74) *Attorney, Agent, or Firm* — WPAT, P.C.

(57) ABSTRACT

The present invention discloses a clock data recovery method having quick locking and bandwidth stabilizing mechanism used in a clock data recovery circuit. A relative position relation between a serial data and a sampling clock is detected by a phase detection circuit in an adaptive control period to generate a tracking direction. The tracking direction of a first clock period is directly outputted as an adaptive tracking direction by an adaptive tracking circuit. For each of the clock periods behind the first clock period, a previous tracking direction is replaced by a current tracking direction only when the current tracking direction exists and is different from the previous tracking direction of a previous clock period such that an actual tracking direction is generated when the adaptive tracking direction changes. The phase of the sampling clock is adjusted according to the actual tracking direction by a clock control circuit.

10 Claims, 4 Drawing Sheets

CLOCK DATA RECOVERY CIRCUIT AND METHOD HAVING QUICK LOCKING AND BANDWIDTH STABILIZING MECHANISM

BACKGROUND OF THE INVENTION

1. Field of the Invention

The present invention relates to a clock data recovery circuit and a clock data recovery method having quick locking and bandwidth stabilizing mechanism.

2. Description of Related Art

In a serial wired transmission system receiver, a clock data recovery circuit determines whether high speed serial data is locked by a sampling clock according to the phase-lead and phase-lag relation between the sampling clock and either the rising edge and falling edge of the data.

The rising edge and the falling edge of the serial data do not appear at a fixed frequency since different data transition densities occur in different time periods. As a result, the tracking ability may differ such that the bandwidth of the clock data recovery circuit is uncertain. Further, a delay exists between the time spot that the clock data recovery circuit detects the condition that either the clock signal leads the data edge or lags the data edge and the time spot that the tracking is performed. Such a delay results in tracking jitters in the clock data recovery circuit, which is a non-linear system. When the transition density is higher, i.e., the bandwidth is larger, the jitters increase linearly. As a result, a tradeoff exists between the bandwidth and the tracking jitters such that the performances thereof cannot improve at the same time.

SUMMARY OF THE INVENTION

In consideration of the problem of the prior art, an object of the present invention is to supply a clock data recovery circuit and a clock data recovery method having quick locking and bandwidth stabilizing mechanism.

The present invention discloses a clock data recovery (CDR) circuit having quick locking and bandwidth stabilizing mechanism that includes a phase detection circuit, an adaptive tracking circuit and a clock control circuit. The phase detection circuit is configured to receive a serial data and a sampling clock to detect a position relation of two clock edges of each of a plurality of clock periods in an adaptive control period of the sampling clock and a data edge of the serial data, to generate a tracking direction. The adaptive tracking circuit is configured to receive the tracking direction of each of the clock periods in series. The adaptive tracking circuit directly outputs the tracking direction that a first clock period of the clock periods corresponds to as an adaptive tracking direction. For each of the other clock periods behind the first clock period in turn being a current clock period and one of the clock periods pervious to the current clock period being a previous clock period, the adaptive tracking circuit replaces a previous tracking direction that the previous clock period corresponds to by a current tracking direction that the current clock period corresponds to as the adaptive tracking direction only when the current tracking direction exists and when the current tracking direction is different from the previous tracking direction. When the adaptive tracking direction varies in the adaptive control period, the adaptive tracking circuit generates an actual tracking direction according to the varied adaptive tracking direction. The clock control circuit is configured to adjust a phase of the sampling clock according to the actual tracking direction.

The present invention also discloses a clock data recovery method having quick locking and bandwidth stabilizing mechanism used in a clock data recovery circuit that includes the steps outlined below. A serial data and a sampling clock are received by a phase detection circuit to detect a position relation of two clock edges of each of a plurality of clock periods in an adaptive control period of the sampling clock and a data edge of the serial data, to generate a tracking direction. The tracking direction of each of the clock periods in series is received by an adaptive tracking circuit. The tracking direction that a first clock period of the clock periods corresponds to is directly outputted as an adaptive tracking direction by the adaptive tracking circuit. For each of the other clock periods behind the first clock period in turn being a current clock period and one of the clock periods pervious to the current clock period being a previous clock period, a previous tracking direction that the previous clock period corresponds to is replaced by a current tracking direction that the current clock period corresponds to as the adaptive tracking direction by the adaptive tracking circuit only when the current tracking direction exists and when the current tracking direction is different from the previous tracking direction. When the adaptive tracking direction varies in the adaptive control period, an actual tracking direction is generated according to the varied adaptive tracking direction. A phase of the sampling clock is adjusted by a clock control circuit according to the actual tracking direction.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide a clock data recovery circuit and a clock data recovery method having quick locking and bandwidth stabilizing mechanism to include the advantage of both quick response and voting mechanism to accomplish the objects of stable bandwidth, less jitter and less delay.

Figure 1:
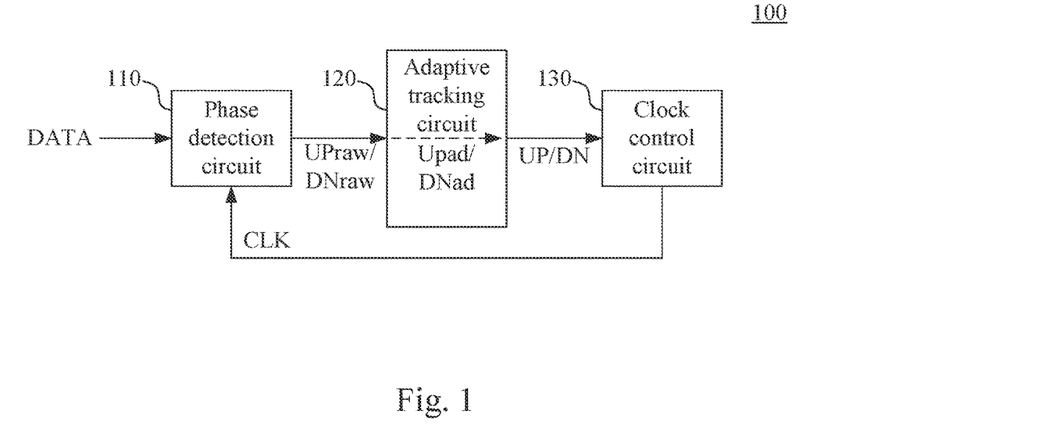
FIG. 1 illustrates a circuit diagram of a clock data recovery circuit having quick locking and bandwidth stabilizing mechanism according to an embodiment of the present invention.

Reference is now made to FIG. 1. FIG. 1 illustrates a circuit diagram of a clock data recovery circuit 100 having quick locking and bandwidth stabilizing mechanism according to an embodiment of the present invention. The clock data recovery circuit 100 includes a phase detection circuit 110, an adaptive tracking circuit 120 and a clock control circuit 130.

Figure 2:
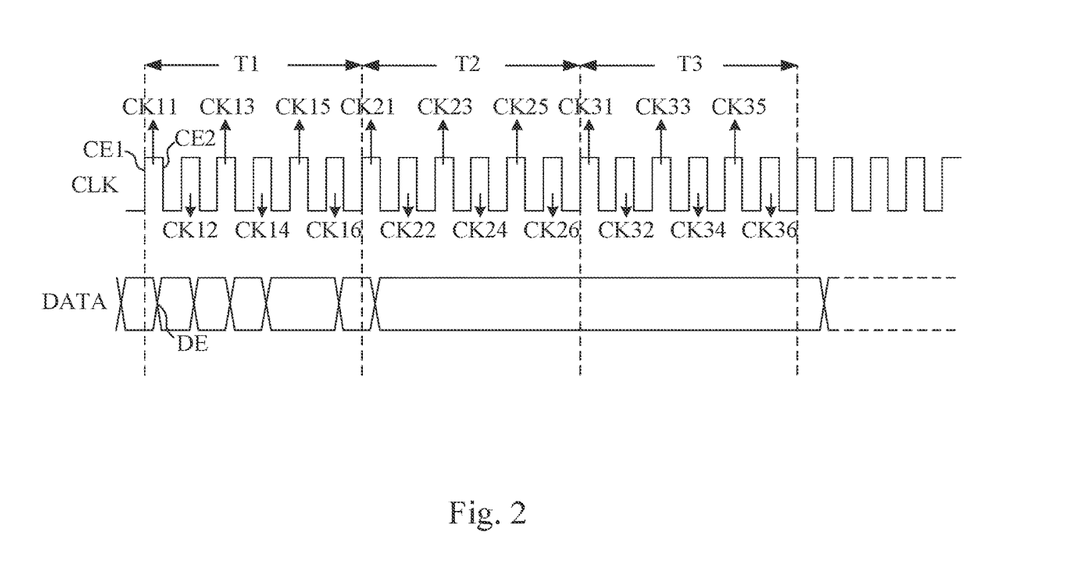
FIG. 2 illustrates a signal waveform diagram of serial data and a sampling clock received by the clock data recovery circuit according to an embodiment of the present invention.

Reference is now made to FIG. 2 at the same time. FIG. 2 illustrates a signal waveform diagram of serial data DATA and a sampling clock CLK received by the clock data recovery circuit 100 according to an embodiment of the present invention.

In an embodiment, the clock data recovery circuit 100 operates in the unit of an adaptive control period. The adaptive control period includes a plurality of clock periods. FIG. 2 exemplarily illustrates three adaptive control period T1~T3 each including 6 clock periods. The adaptive control period T1 includes 6 clock periods CK11~CK16, the adaptive control period T2 includes 6 clock periods CK21~CK26, and the adaptive control period T3 includes 6 clock periods CK31~CK36.

The phase detection circuit 110 is configured to receive the serial data DATA and the sampling clock CLK. The phase detection circuit 110 detects a position relation of two clock edges of each of the clock periods in each of the adaptive control periods of the sampling clock CLK and a data edge of the serial data DATA, to generate a tracking direction UPraw/DNraw.

In FIG. 2, two clock edges CE1 and CE2 of the clock period CK11 and the data edge DE that the clock edges CE1 and CE2 perform detection thereon in the adaptive control period T1 are exemplarily labeled. In an embodiment, the clock edges CE1 and CE2 are a rising edge and a falling edge.

In an embodiment, when the data included by the serial data DATA has transitions between 0 and 1, e.g., the part of the data in FIG. 2 that the clock periods CK11~CK14 sample, the data edge exists. Under such a condition, the tracking direction UPraw/DNraw that the phase detection circuit 110 generates exists, and the tracking direction UPraw/DNraw is determined by the phase detection circuit 110 according to the position relation of the clock edges CE1 and CE2 and the data edge DE. When the tracking direction UPraw/DNraw exists, the tracking direction UPraw/DNraw is either forward or backward.

On the other hand, when the data included by the serial data DATA has a section of successive 0s or successive 1s, e.g., the part of the data in FIG. 2 that the clock period 15 samples, the data edge DE does not exist. The phase detection circuit 110 cannot determine the position relation of the clock edges and the data edge DE. Under such a condition, the tracking direction UPraw/DNraw that the phase detection circuit 110 generates does not exist.

In an embodiment, the tracking direction UPraw/DNraw is expressed by a forward parameter UPraw and a backward parameter DNraw. When the forward parameter UPraw is 1 and the backward parameter DNraw is 0, the tracking direction UPraw/DNraw is expressed as (1,0) that stands for 'forward'. When the forward parameter UPraw is 0 and the backward parameter DNraw is 1, the tracking direction UPraw/DNraw is expressed as (0,1) that stands for 'backward'. When the forward parameter UPraw is 0 and the backward parameter DNraw is 0, the tracking direction UPraw/DNraw is expressed as (0,0) that stands for 'not exist'.

It is appreciated that the format of the expression described above is merely an example. In other embodiments, the tracking direction UPraw/DNraw may be expressed by using other formats.

The adaptive tracking circuit 120 is configured to receive the tracking direction UPraw/DNraw of each of the clock periods in series, and generate an adaptive tracking direction UPad/DNad in every adaptive control period. In an embodiment, the adaptive tracking direction UPad/DNad can also be expressed by a forward parameter UPad and a backward parameter DNad.

The operation of the adaptive tracking circuit 120 is described by using the adaptive control period T1~T3 in a usage scenario. In such a usage scenario, the tracking directions UPraw/DNraw corresponding to the clock periods CK11~CK16 in the adaptive control period T1 are 'forward', 'backward', 'forward', 'forward', 'not exist' and 'backward'. The tracking directions UPraw/DNraw corresponding to the clock periods CK21~CK26 in the adaptive control period T2 are 'forward', 'not exist', 'not exist', 'not exist', 'not exist' and 'not exist'. The tracking directions UPraw/DNraw corresponding to the clock periods CK31~CK36 in the adaptive control period T3 are all 'not exist'.

At first, for every adaptive control period, no matter what the tracking direction finally outputted in a previous adaptive control period is, the adaptive tracking circuit 120 directly outputs the tracking direction UPraw/DNraw that a first clock period of the clock periods corresponds to as the adaptive tracking direction UPad/DNad.

For the adaptive control period T1, since the tracking direction UPraw/DNraw that the first clock period CK11 corresponds to is 'forward', the adaptive tracking circuit 120 directly outputs the tracking direction of 'forward' as the adaptive tracking direction UPad/DNad.

Moreover, for each of the other clock periods behind the first clock period in turn being a current clock period and one of the clock periods pervious to the current clock period being a previous clock period, the adaptive tracking circuit 120 determines whether the current tracking direction that the current clock period corresponds to exists, and further determines whether the current tracking direction is different from a previous tracking direction that the previous clock period corresponds to. The adaptive tracking circuit 120 replaces the previous tracking direction by the current tracking direction as the adaptive tracking direction UPad/DNad only when the current tracking direction exists and is different from the previous tracking direction.

Since the current tracking direction that the clock periods CK12 corresponds to exists and is 'backward', which is different from the previous tracking direction ('forward') that the clock period CK11 corresponds to, the adaptive tracking circuit 120 replaces the previous tracking direction by the current tracking direction as the adaptive tracking direction UPad/DNad. Under such a condition, the adaptive tracking direction UPad/DNad becomes 'backward'.

Since the current tracking direction that the clock periods CK13 corresponds to exists and is 'forward', which is different from the previous tracking direction ('backward') that the clock period CK12 corresponds to, the adaptive tracking circuit 120 replaces the previous tracking direction by the current tracking direction as the adaptive tracking direction UPad/DNad. Under such a condition, the adaptive tracking direction UPad/DNad becomes 'forward'.

On the other hand, when the current tracking direction exists and is the same as the previous tracking direction, the adaptive tracking circuit 120 keeps the previous tracking direction to be the adaptive tracking direction UPad/DNad such that the adaptive tracking direction UPad/DNad is not varied.

Since the current tracking direction that the clock periods CK14 corresponds to exists and is 'forward', which is the same as the previous tracking direction ('forward') that the clock period CK13 corresponds to, the adaptive tracking circuit 120 keeps the previous tracking direction to be the adaptive tracking direction UPad/DNad. Under such a condition, the adaptive tracking direction UPad/DNad becomes 'forward'.

On yet the other hand, when the current tracking direction does not exist, the adaptive tracking circuit 120 also keeps the previous tracking direction to be the adaptive tracking direction UPad/DNad such that the adaptive tracking direction UPad/DNad is not varied.

Since the current tracking direction that the clock periods CK15 corresponds to does not exist ('not exist'), the adaptive tracking circuit 120 keeps the previous tracking direction to be the adaptive tracking direction UPad/DNad. Under such a condition, the adaptive tracking direction UPad/DNad becomes 'forward'.

Besides, when the previous tracking direction does not exist ('not exist') and the current tracking direction exists, the current tracking direction is different from the previous tracking direction. As a result, the adaptive tracking circuit 120 replaces the previous tracking direction by the current tracking direction as the adaptive tracking direction UPad/DNad.

Since the current tracking direction that the clock periods CK16 corresponds to exists and is 'backward', which is different from the previous tracking direction ('not exist') that the clock period CK15 corresponds to, the adaptive tracking circuit 120 replaces the previous tracking direction by the current tracking direction as the adaptive tracking direction UPad/DNad. Under such a condition, the adaptive tracking direction UPad/DNad becomes 'backward'.

For the adaptive control period T2, since the tracking direction UPraw/DNraw that the first clock period CK21 corresponds to is 'forward', the adaptive tracking circuit 120 directly outputs the tracking direction 'forward' as the adaptive tracking direction UPad/DNad. Since the current tracking direction of each of the clock periods CK22~CK26 behind the clock periods CK21 does not exist ('not exist'), the adaptive tracking circuit 120 keeps the previous tracking direction to be the adaptive tracking direction UPad/DNad based on the mechanism described above. Under such a condition, the adaptive tracking direction UPad/DNad is kept to be 'forward'.

For the adaptive control period T3, since the tracking direction UPraw/DNraw that the first clock period CK31 corresponds to does not exist ('not exist'), the adaptive tracking circuit 120 directly outputs the tracking direction 'not exist' as the adaptive tracking direction UPad/DNad. Since the current tracking direction of each of the clock periods CK32~CK36 behind the clock periods CK31 does not exist ('not exist'), the adaptive tracking circuit 120 keeps the previous tracking direction to be the adaptive tracking direction UPad/DNad based on the mechanism described above. Under such a condition, the adaptive tracking direction UPad/DNad is kept to be 'not exist'.

When the adaptive tracking direction UPad/DNad varies in the adaptive control period, the adaptive tracking circuit 120 generates an actual tracking direction UP/DN according to the varied adaptive tracking direction UPad/DNad.

Moreover, the clock control circuit 130 is configured to adjust a phase of the sampling clock CLK according to the actual tracking direction UP/DN. More specifically, the clock control circuit 130 forwards the phase of the sampling clock CLK when the actual tracking direction UP/DN is forward, backwards the phase of the sampling clock CLK when the actual tracking direction UP/DN is backward and does not vary the phase of the sampling clock CLK when the adaptive tracking direction is varied such that the actual tracking direction UP/DN does not exist.

Based on the above description, in every adaptive control period, when the adaptive tracking circuit 120 keeps outputting the same existed tracking direction as the adaptive tracking direction UPad/DNad, only the actual tracking direction UP/DN generated at the first time is determined to be 'exist' (either 'forward' or 'backward'). The actual tracking direction UP/DN generated subsequently is determined to be 'not exist'. As a result, the clock control circuit 130 only adjusts the phase of the sampling clock CLK according to the tracking direction generated at the first time and does not perform adjustment subsequently since the tracking direction is kept the same.

For example, in the adaptive control period T1, the adaptive tracking circuit 120 in turn outputs the tracking direction of 'forward', 'backward', 'forward', 'forward', 'forward' and 'backward' as the adaptive tracking direction UPad/DNad. Under such a condition, the actual tracking direction UP/DN generated by the adaptive tracking circuit 120 is 'forward', 'backward', 'forward', 'not exist', 'not exist' and 'backward'. The clock control circuit 130 in turn adjusts the phase of the sampling clock CLK with the actions of 'forward', 'backward', 'forward', 'no action', 'no action' and 'backward'.

Figure 3:
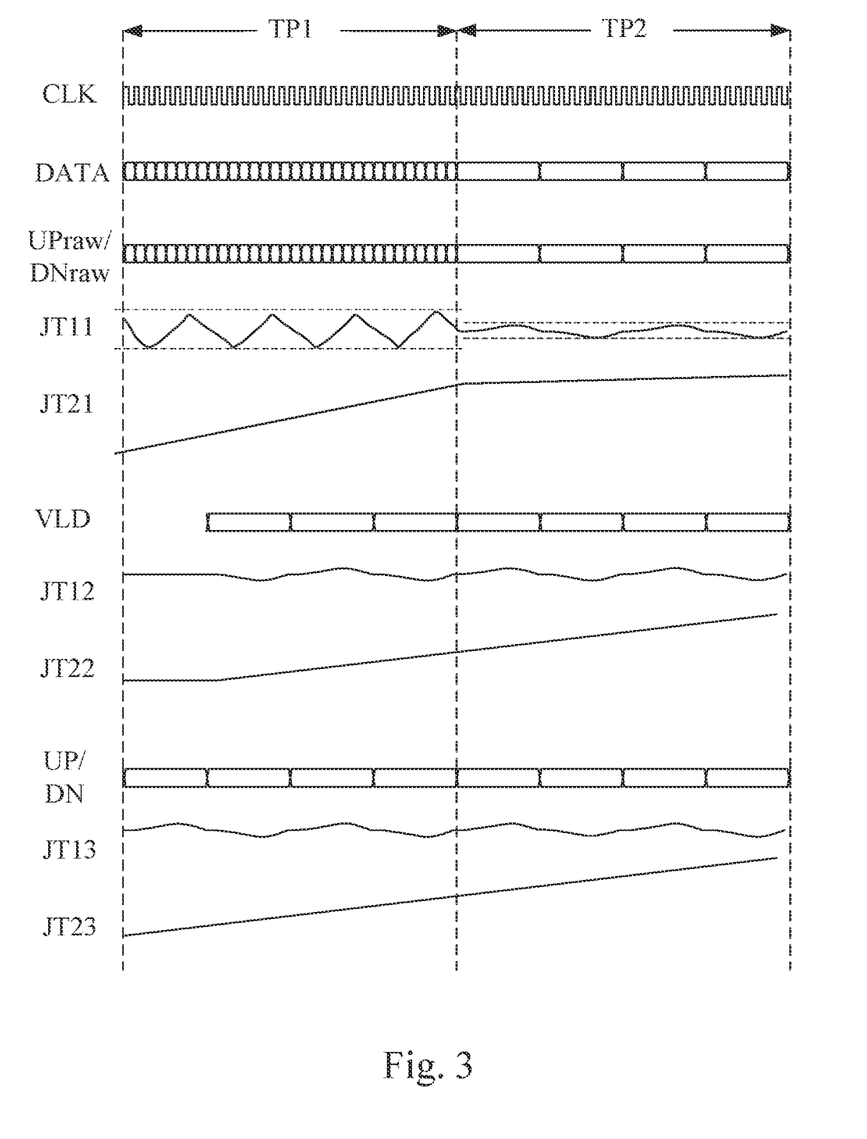
FIG. 3 illustrates a waveform diagram of signals related to the clock data recovery circuit according to an embodiment of the present invention.

Reference is now made to FIG. 3. FIG. 3 illustrates a waveform diagram of signals related to the clock data recovery circuit 100 according to an embodiment of the present invention. The signals illustrated in FIG. 3 includes the sampling clock CLK, the serial data DATA, the tracking direction UPraw/DNraw, a voting mechanism tracking direction VLD, the actual tracking direction Us/DN, corresponding high frequency jitter conditions JT11~JT13 and corresponding low frequency slewing conditions JT21~JT23.

As illustrated in FIG. 3, the serial data DATA has more frequent transitions between 0 and 1 in the time interval TP1 such that more data edges are available for tracking direction detection. The serial data DATA has less frequent transitions between 0 and 1 in the time interval TP2 such that less data edges are available for tracking direction detection. The tracking direction UPraw/DNraw has more variation under the condition that the serial data DATA has more frequent transitions, and the tracking direction UPraw/DNraw has less variation under the condition that the serial data DATA has less frequent transitions. The actual tracking direction UP/DN is illustrated by using each of a plurality of adaptive control periods as a unit in FIG. 3.

In an embodiment, the tracking mechanism is performed directly according to the tracking direction of all the clock periods and has the advantage of quick response. Such a method corresponds to the high frequency jitter condition JT11 and the low frequency slewing condition JT21.

As the high frequency jitter condition JT21 shows, the direct locking method has a large amount of jitters when the serial data DATA has more frequent transitions. Further, as the low frequency slewing condition JT21 shows, the direct locking method has a low slewing when the serial data DATA has less frequent transitions and thus limits the frequency bandwidth of the clock data recovery.

In another embodiment, the tracking mechanism is performed by voting. More specifically, after a certain number of clock periods (e.g., 8) has passed, the number of the tracking direction 'forward' and the number of the tracking direction 'backward' that all these clock periods correspond to are accumulated such that the final tracking direction is generated according to the accumulation result. The tracking is performed only once after these clock periods has passed according to the final tracking direction. Such a method corresponds to the voting mechanism tracking direction VLD, the high frequency jitter condition JT12 and the low frequency slewing condition JT22.

As the high frequency jitter condition JT12 shows, the tracking method using the voting mechanism greatly improves the jitters when the serial data DATA has more frequent transitions. However, as the voting mechanism tracking direction VLD and the low frequency slewing condition JT22 show, though a steady high frequency slewing performance is obtained, the tracking method using the voting mechanism has to perform tracking after the accumulation is finished. A delay is thus presented such that the tracking method using the voting mechanism cannot provide a quick response.

The clock data recovery circuit of the present invention can perform tracking in the first clock period in every adaptive control period to satisfy the quick response requirement. Further, behind the first clock periods, the tracking direction is varied only when the tracking direction of the current clock period is different from the tracking direction of the previous clock period. Such a method corresponds to the actual tracking direction UP/DN, the high frequency jitter condition JT13 and the low frequency slewing condition JT23.

As the high frequency jitter condition JT13 shows, the clock data recovery circuit of the present invention also greatly improves the jitters when the serial data DATA has more frequent transitions. Moreover, as the actual tracking direction UP/DN and the low frequency slewing condition JT13 show, the clock data recovery circuit of the present invention not only has a steady high frequency slewing performance, but also provides a quick response tracking method. The delay is thus greatly reduced. As a result, the clock data recovery circuit of the present invention has the advantages of both quick response and voting mechanism to accomplish the objects of stable bandwidth, less jitter and less delay.

Figure 4:
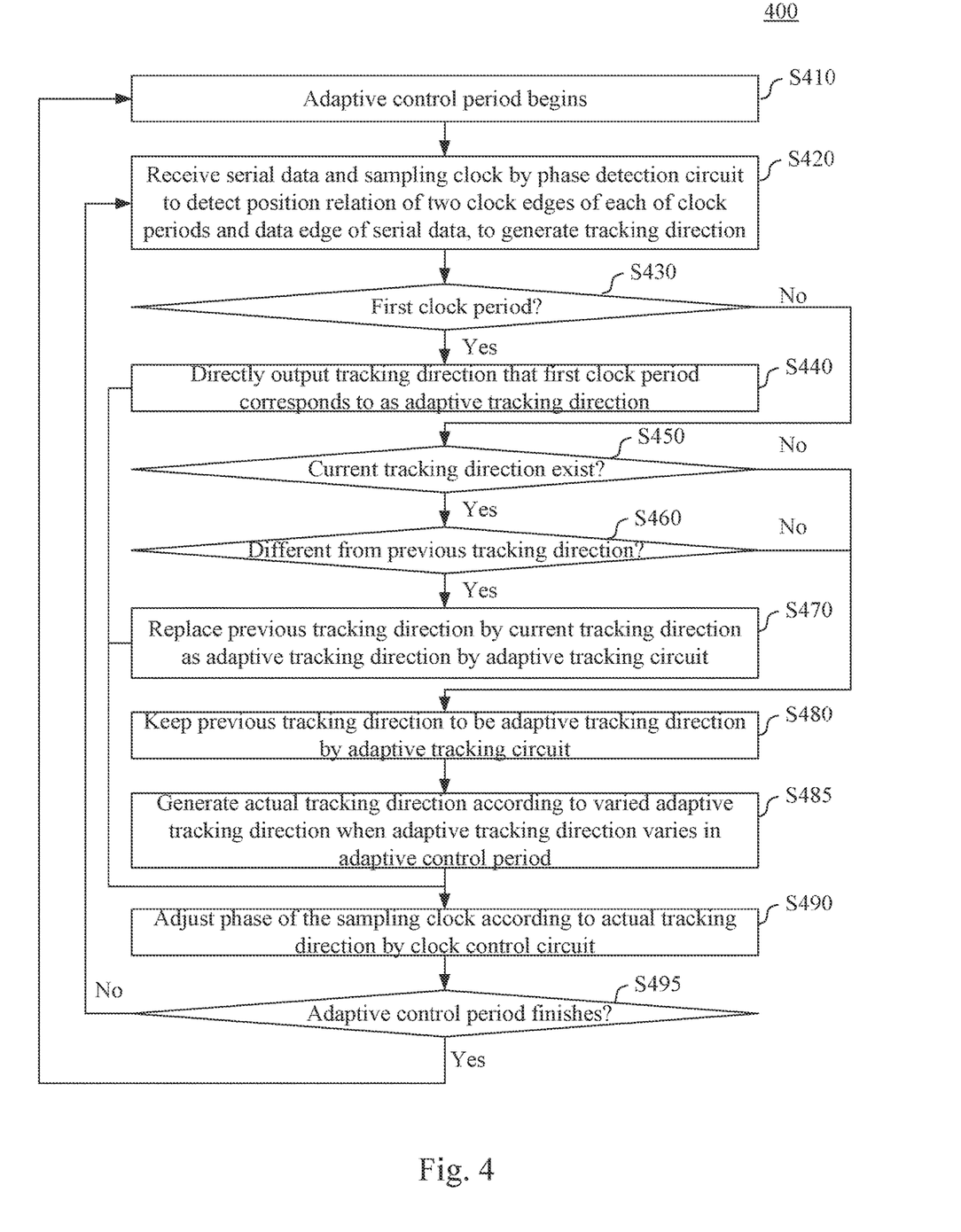
FIG. 4 illustrates a flow chart of a clock data recovery method having quick locking and bandwidth stabilizing mechanism according to an embodiment of the present invention.

Reference is now made to FIG. 4. FIG. 4 illustrates a flow chart of a clock data recovery method 400 having quick locking and bandwidth stabilizing mechanism according to an embodiment of the present invention.

In addition to the apparatus described above, the present disclosure further provides the clock data recovery method 400 having quick locking and bandwidth stabilizing mechanism that can be used in such as, but not limited to, the clock data recovery circuit 100 in FIG. 1. As illustrated in FIG. 4, an embodiment of the clock data recovery method 400 includes the following steps.

In step S410, the adaptive control period begins. The adaptive control period includes a plurality of clock periods of the sampling clock CLK.

In step S420, the serial data DATA and the sampling clock CLK are received by the phase detection circuit 110 to detect the position relation of two clock edges of each of the clock periods and the data edge of the serial data DATA, to generate the tracking direction UPraw/DNraw such that the adaptive tracking circuit 120 receives the tracking direction UPraw/DNraw corresponding to the clock periods.

In step S430, whether the current clock period is the first clock period of the clock periods is determined by the adaptive tracking circuit 120.

In step S440, when the current clock period is the first clock period of the clock periods, the tracking direction UPraw/DNraw that the first clock period corresponds to is directly outputted as the adaptive tracking direction UPad/DNad by the adaptive tracking circuit 120.

In step S450, when the current clock period is not the first clock period of the clock periods, whether the current tracking direction that the current clock period corresponds to exist is determined.

In step S460, when the current tracking direction exists, whether the current tracking direction is different from the previous tracking direction that the previous clock period corresponds to is determined by the adaptive tracking circuit 120.

In step S470, when the current tracking direction is different from the previous tracking direction, the previous tracking direction is replaced by the current tracking direction as the adaptive tracking direction UPad/DNad by the adaptive tracking circuit 120.

In step S480, when the condition that the current tracking direction does not exist is determined in step S430, or when the condition that the current tracking direction is the same as the previous tracking direction is determined in step S440, the previous tracking direction is kept to be the adaptive tracking direction UPad/DNad by the adaptive tracking circuit 120.

In step S485, after step S440, step S470 and step S480, the actual tracking direction UP/DN is generated according to the varied adaptive tracking direction UPad/DNad by the adaptive tracking circuit 120 when the adaptive tracking direction UPad/DNad varies in the adaptive control period.

In step S490, the phase of the sampling clock CLK is adjusted according to the actual tracking direction UP/DN by the clock control circuit 130.

In step S495, after step S490 is finished, whether the adaptive control period finishes is determined by the adaptive tracking circuit 120. When adaptive control period does not finish, the flow goes back to step S420 to keep receiving the tracking direction UPraw/DNraw of other clock periods. When the adaptive control period finishes, the flow goes back to step S410 to operate in the next adaptive control period.

It is appreciated that the embodiments described above are merely an example. In other embodiments, it should be appreciated that many modifications and changes may be made by those of ordinary skill in the art without departing, from the spirit of the disclosure.

Figure 5:
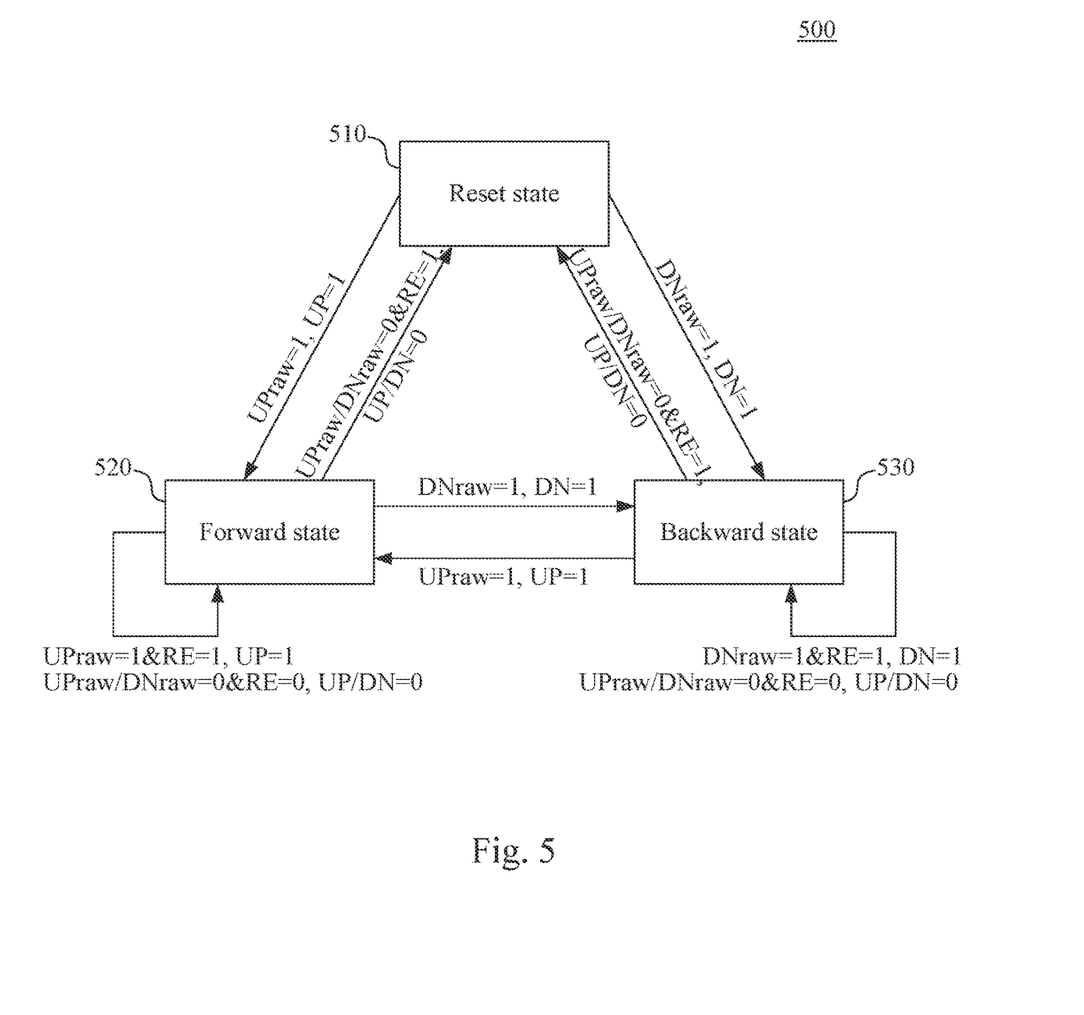
FIG. 5 illustrates a diagram of a finite state machine that describes the operation of the clock data recovery circuit according to an embodiment of the present invention.

Reference is now made to FIG. 5. FIG. 5 illustrates a diagram of a finite state machine 500 that describes the operation of the clock data recovery circuit 100 according to an embodiment of the present invention.

As illustrated in FIG. 5, the adaptive tracking direction UPad/DNad includes states 510~530. The state 510 is a "reset state", the state 520 is a "forward state" and the state 530 is a "backward state". The forward parameter UPraw and the backward parameter DNraw of the tracking direction UPraw/DNraw that each of the clock periods corresponds to and a reset parameter RE that determines whether a new adaptive control period is entered (e.g., whether the current clock period is the first clock period of the adaptive control period) together determines the switching of the states. The forward parameter and the backward parameter of the actual tracking direction UP/DN are correspondingly outputted. Since the forward parameter and the backward parameter cannot have the value 1 at the same time, the description of "one of the forward parameter and the backward parameter is 1" in the following paragraphs implies that the other one of the forward parameter and the backward parameter is 0.

At first, under the condition that the clock data recovery circuit 100 operates in the state 510 that corresponds to the "reset state", when the forward parameter UPraw is 1, the clock data recovery circuit 100 sets the forward parameter UP that the actual tracking direction UP/DN corresponds to as 1 and switches to the state 520 that corresponds to the "forward state". Besides, when the backward parameter DNraw is 1, the clock data recovery circuit 100 sets the backward parameter DN that the actual tracking direction UP/DN corresponds to as 1 and switches to the state 530 that corresponds to the "backward state".

Under the condition that the clock data recovery circuit 100 operates in the state 520, when the forward parameter UPraw is 1 and the reset parameter RE is 1, the clock data recovery circuit 100 sets the forward parameter UP that the actual tracking direction UP/DN corresponds to as 1 and stays in the state 520. Besides, when both of the forward parameter UPraw and the backward parameter DNraw are 0 and the reset parameter RE is 0, the clock data recovery circuit 100 sets both of the forward parameter UP and the backward parameter DN that the actual tracking direction UP/DN corresponds to as 0 and stays in the state 520.

When the backward parameter DNraw is 1, the clock data recovery circuit 100 sets the backward parameter DN that the actual tracking direction UP/DN corresponds to as 1 and switches to the state 530 that corresponds to the "backward state".

Under the condition that the clock data recovery circuit 100 operates in the state 530, when the backward parameter DNraw is 1 and the reset parameter RE is 1, the clock data recovery circuit 100 sets the backward parameter DN that the actual tracking direction UP/DN corresponds to as 1 and stays in the state 530. Besides, when both of the forward parameter UPraw and the backward parameter DNraw are 0 and the reset parameter RE is 0, the clock data recovery circuit 100 sets both of the forward parameter UP and the backward parameter DN that the actual tracking direction UP/DN corresponds to as 0 and stays in the state 530.

When the forward parameter UPraw is 1, the clock data recovery circuit 100 sets the forward parameter UP that the actual tracking direction UP/DN corresponds to as 1 and switches to the state 520 that corresponds to the "forward state".

Under the condition that the clock data recovery circuit 100 operates in either the state 520 or the state 530, when both of the forward parameter UPraw and the backward parameter DNraw are 0 and the reset parameter RE is 1, the clock data recovery circuit 100 sets both of the forward parameter UP and the backward parameter DN that the actual tracking direction UP/DN corresponds to as 0 and switches to the state 510 that corresponds to the "reset state".

In summary, the present invention discloses the clock data recovery circuit and the clock data recovery method having quick locking and bandwidth stabilizing mechanism that includes the advantage of both quick response and voting mechanism to accomplish the objects of stable bandwidth, less jitter and less delay.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A clock and data recovery (CDR) circuit having quick locking and bandwidth stabilizing mechanism, the CDR circuit comprising:
    a phase detection circuit configured to receive a serial data and a sampling clock to detect a position relation of two clock edges of each of a plurality of clock periods in an adaptive control period of the sampling clock and a data edge of the serial data, and to generate a tracking direction according to the position relation;
    an adaptive tracking circuit configured to:
        receive the tracking direction of each of the clock periods in series;
        directly output the tracking direction that a first clock period of the clock periods corresponds to an adaptive tracking direction;
        for each of the other clock periods behind the first clock period in turn being a current clock period and one of the clock periods pervious to the current clock period being a previous clock period, replace a previous tracking direction that the previous clock period corresponds to by a current tracking direction that the current clock period corresponds to the adaptive tracking direction only when the current tracking direction exists and when the current tracking direction is different from the previous tracking direction; and
        when the adaptive tracking direction varies in the adaptive control period, generate an actual tracking direction according to the varied adaptive tracking direction; and
    a clock control circuit configured to adjust a phase of the sampling clock according to the actual tracking direction.

2. The CDR circuit of claim 1, wherein the tracking direction is either forward or backward when the data edge exists, and the tracking direction does not exist when the data edge does not exist.

3. The CDR circuit of claim 2, wherein the clock control circuit forwards the phase of the sampling clock when the actual tracking direction is forward, backwards the phase of the sampling clock when the actual tracking direction is backward and does not vary the phase of the sampling clock when the adaptive tracking direction is varied in a manner that the actual tracking direction does not exist.

4. The CDR circuit of claim 2, wherein when either the condition that the current tracking direction exists and is the same as the previous tracking direction occurs, or the condition that the current tracking direction does not exist occurs, the adaptive tracking circuit keeps the previous tracking direction to be the adaptive tracking direction in a manner that the adaptive tracking direction is not varied.

5. The CDR circuit of claim 2, wherein when the tracking direction that the first clock period corresponds to does not exist, and when the current tracking direction that each of the other clock periods behind the first clock period does not exist, the adaptive tracking direction does not exist in a manner that the adaptive tracking direction does not exist.

6. A clock and data recovery (CDR) method having quick locking and bandwidth stabilizing mechanism used in a CDR circuit, the CDR method comprising:
    receiving a serial data and a sampling clock by a phase detection circuit to detect a position relation of two clock edges of each of a plurality of clock periods in an adaptive control period of the sampling clock and a data edge of the serial data, and to generate a tracking direction according to the position relation;

receiving the tracking direction of each of the clock periods in series by an adaptive tracking circuit;

directly outputting the tracking direction that a first clock period of the clock periods corresponds to an adaptive tracking direction by the adaptive tracking circuit;

for each of the other clock periods behind the first clock period in turn being a current clock period and one of the clock periods pervious to the current clock period being a previous clock period, replacing a previous tracking direction that the previous clock period corresponds to by a current tracking direction that the current clock period corresponds to the adaptive tracking direction by the adaptive tracking circuit only when the current tracking direction exists and when the current tracking direction is different from the previous tracking direction; and when the adaptive tracking direction varies in the adaptive control period, generating an actual tracking direction according to the varied adaptive tracking direction; and adjusting a phase of the sampling clock by a clock control circuit according to the actual tracking direction.

7. The CDR method of claim 6, wherein the tracking direction is either forward or backward when the data edge exists and the tracking direction does not exist when the data edge does not exist.

8. The CDR method of claim 7, further comprising:

forwarding the phase of the sampling clock when the actual tracking direction is forward by the clock control circuit;

backwarding the phase of the sampling clock when the actual tracking direction is backward; and not varying the phase of the sampling clock by the clock control circuit when the adaptive tracking direction is varied in a manner that the actual tracking direction does not exist.

9. The CDR method of claim 7, further comprising:

keeping the previous tracking direction to be the adaptive tracking direction by the adaptive tracking circuit in a manner that the adaptive tracking direction is not varied when either the condition that the current tracking direction exists and is the same as the previous tracking direction occurs, or the condition that the current tracking direction does not exist occurs.

10. The CDR method of claim 7, when the tracking direction that the first clock period corresponds to does not exist, and when the current tracking direction that each of the other clock periods behind the first clock period does not exist, the adaptive tracking direction does not exist in a manner that the adaptive tracking direction does not exist.

* * * * *